United States Patent [19]

Watson et al.

[11] Patent Number: 5,444,394
[45] Date of Patent: Aug. 22, 1995

[54] PLD WITH SELECTIVE INPUTS FROM LOCAL AND GLOBAL CONDUCTORS

[75] Inventors: James A. Watson, Santa Clara; Cameron R. McClintock, Mountain View; Hiten S. Randhawa; Ken M. Li, both of Santa Clara; Bahram Ahanin, Cupertino, all of Calif.

[73] Assignee: Altera Corporation, San Jose, Calif.

[21] Appl. No.: 88,973

[22] Filed: Jul. 8, 1993

[51] Int. Cl.⁶ ............................................. H03K 19/177
[52] U.S. Cl. ......................................... 326/45; 326/41
[58] Field of Search ............... 307/465; 340/825.83, 340/825.87; 326/41, 45

[56] References Cited

U.S. PATENT DOCUMENTS

| | | | |
|---|---|---|---|
| 4,706,216 | 11/1987 | Carter | 307/465 |
| 4,963,768 | 10/1990 | Agrawal et al. | 307/465 |
| 5,095,523 | 3/1992 | Delaruelle et al. | 307/465 |
| 5,241,224 | 8/1993 | Pedersen et al. | 307/465 |
| 5,260,610 | 11/1993 | Pedersen et al. | 307/465 |
| 5,260,611 | 11/1993 | Cliff et al. | 307/465 |
| 5,268,598 | 12/1993 | Pedersen et al. | 307/465 |
| 5,274,581 | 12/1993 | Cleff | 364/768 |
| 5,302,865 | 4/1994 | Steele et al. | 307/465 |
| 5,309,046 | 5/1994 | Steele | 307/465 |

*Primary Examiner*—Edward P. Westin
*Assistant Examiner*—Benjamin D. Driscoll
*Attorney, Agent, or Firm*—Townsend and Townsend Khourie and Crew

[57] ABSTRACT

A programmable logic device is presented comprising a global interconnect array whose lines are fed via programmable multiplexers to two stacks of logic array blocks on its sides. The logic array blocks include CMOS look up table based logic modules that consume zero DC power. The global interconnect array lines are fed to the multiplexers in a specific pattern which maximizes routing flexibility and speed. The combination of low power logic array blocks and high performance global interconnect array allows for increased logic density at lower power consumption compared to prior art programmable logic array devices.

7 Claims, 6 Drawing Sheets

PLD WITH SELECTIVE INPUTS FROM LOCAL AND GLOBAL CONDUCTORS

BACKGROUND OF THE INVENTION

This invention relates to programmable logic array (PLA) integrated circuits, and more particularly to a PLA integrated circuit that combines low power circuitry with high performance interconnect architecture.

As shown by commonly-assigned U.S. Pat. No. 4,871,930 ("Wong"), which is hereby incorporated by reference in its entirety, and the references cited therein, programmable logic devices (PLD's) are well known integrated circuits. As described in Wong, a major obstacle in increasing the logic density in previously known PLDs was the size of the single global interconnection array which increased as the square of the number of output functions. This obstacle was overcome to a large extent by the use of a programmable interconnect array ("PIA") disclosed in Wong. In a PLD using a PIA, a single global interconnection array using erasable programmable read-only memory ("EPROM") cells was used to route signals to and from logic array blocks ("LABs") which contained logic elements, logic modules, and a local interconnection array.

The architecture using PIAs and LABs disclosed in Wong produced a generation of successful PLDs available commercially from Altera Corporation of San Jose, Calif. Yet, to meet ever increasing technological demands, PLDs have been constantly increasing in both size and complexity. In particular, to achieve higher logic density, more logic elements have been incorporated into PLDs and this has necessitated increasing the size of the PIA. However, a significant amount of the power used in PLDs is consumed in the programmable elements of the PIA, and a speed limitation is capacitive loading in the programmable elements of the PIA. Increasing the size of the PIA, therefore, leads undesirably to higher power consumption and reduction in speed.

An enhancement to the PIA was disclosed in a commonly-assigned U.S. patent application Ser. No. 07/691,640, filed Apr. 25, 1991, now U.S. Pat. No. 5,241,224, that successfully addressed the above problems associated with increased chip density. It was realized that, as the complexity of PLDs increases, the increase in the number of programmable elements in the PIA is responsible for a significant increase in the amount of the power consumed, and is responsible for a significant decrease in the speed due to the capacitive loading of EPROM cells. Furthermore, it was observed that only a small fraction of the total number of EPROM cells in the PIA is used, so that most of the increased capacitive loading and power consumption is unnecessary.

Accordingly, in the enhanced PIA architecture, the programmable elements and thus their associated power consumption and capacitive loading were eliminated by an alternative global interconnect array (GIA) architecture. In the GIA, selected global conductors are connected to the inputs of a group of multiplexers in a predetermined pattern, and the outputs of the multiplexers are connected to the inputs of logic modules in the LABs. Programmability through the use of a global EPROM in the PIA of the prior PLDs is replaced by programmability of the multiplexers connected to the GIA. The multiplexers are controlled by an array of programmable architecture bits so that the signals on selected global conductors can be routed to the inputs of selected logic modules.

Replacement of the PIA with GIA allowed for higher logic density than previously possible. For example, a preferred embodiment of the GIA architecture disclosed in the above-mentioned co-pending patent application Ser. No. 691,640 provides up to twice the density of the EPM5128, available commercially from Altera Corporation of San Jose, Calif. That embodiment comprises sixteen LABs interconnected with a high speed GIA, with each LAB containing sixteen logic modules that share a programmable local EPROM array.

While significant improvements in chip density, power consumption and speed are realized by the replacement of the PIA with the GIA, the DC power consumed by the EPROM based product term logic places an upper limit on the practical density achievable. Even for smaller numbers of product terms, the presence of DC power consumption on a chip can limit the range of its applicability.

There is therefore a need for an improved programmable logic device that can achieve higher logic densities at lower levels of power consumption.

SUMMARY OF THE INVENTION

It is an object of the present invention to provide an improved PLD integrated circuit that combines low power circuitry with high performance interconnect architecture to achieve higher logic densities.

The PLD circuit of the present invention accomplishes this object by combining the high performance global interconnect array (GIA) architecture with logic array blocks (LABs) that use zero-power CMOS logic modules. The CMOS logic module includes a multi-input look-up table and a flip-flop type device for implementing the logic. The GIA employs a very fast multiplexer-based interconnect network to carry all signals that must span across LAB boundaries, as well as all input signals into the device.

By replacing the EPROM-based product term logic with a look-up table based CMOS logic module, power consumption limitations associated with increased chip density are removed to a great extent. At the same time, the highly flexible and fast GIA network allows for further increases in logic density on a PLD.

Accordingly, in a preferred embodiment, the present invention provides a programmable logic device that includes: a plurality of zero-power logic modules, each having a plurality of inputs and at least one output, the logic modules being grouped in a plurality of logic array blocks, with the logic array blocks disposed in two vertical stacks; a plurality of global conductors interposed between the two stacks of logic array blocks, with a subset of the global conductors coupled to the zero-power logic module outputs; and a plurality of programmable selection means, each having a plurality of inputs coupled to a corresponding subset of the plurality of global conductors and an output coupled to an input of the plurality of logic module inputs, the selection means for programmably coupling a global conductor to a zero-power logic module input.

A further understanding of the nature and advantages of the present invention may be gained by reference to the following detailed description and drawings.

DESCRIPTION OF THE SPECIFIC EMBODIMENT

A. Overall Architecture

Figure 1:
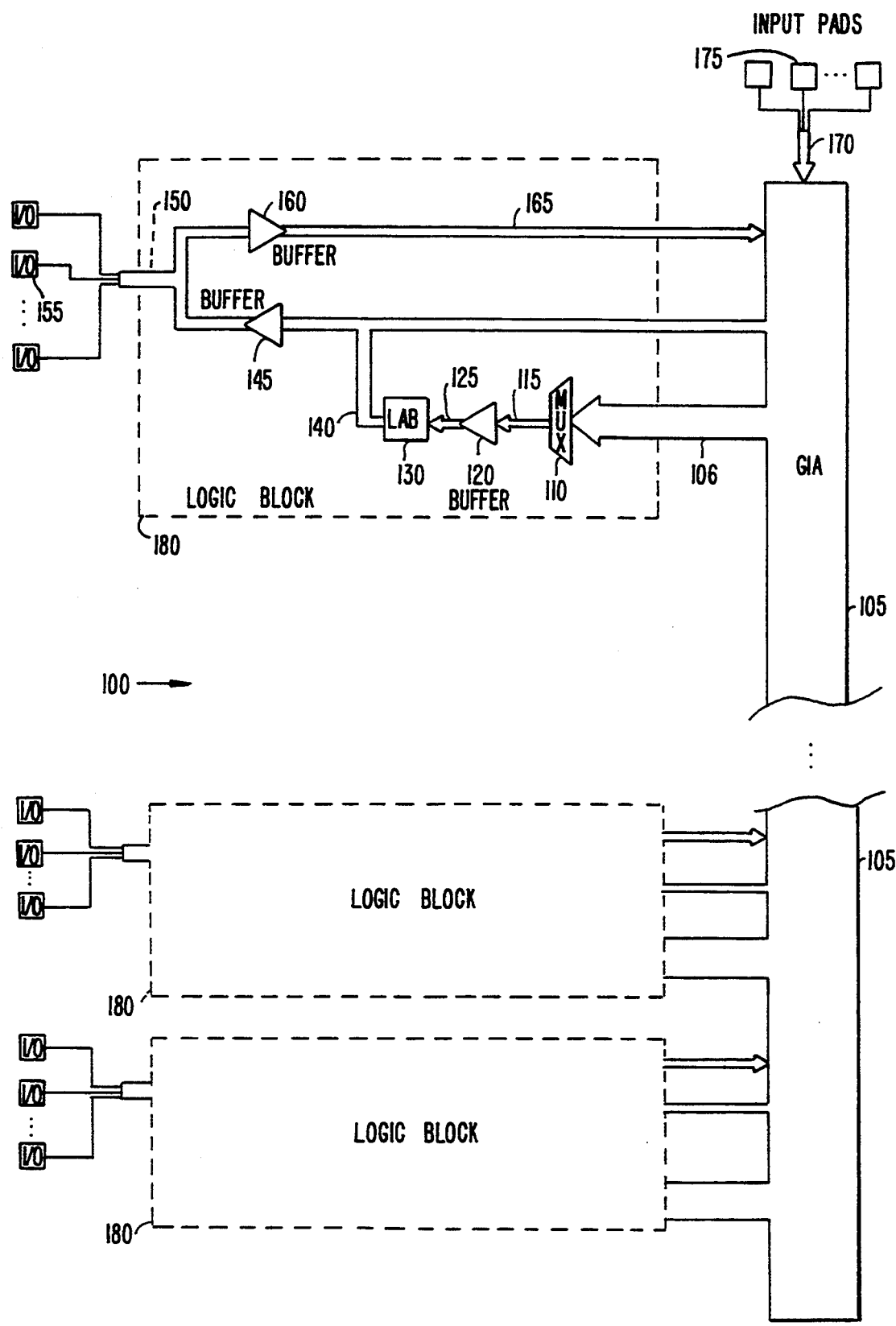
FIG. 1 is a simplified schematic block diagram of an illustrative embodiment of the present invention.

FIG. 1 is a simplified block diagram of an illustrative embodiment of a programmable logic device ("PLD") 100 constructed in accordance with the present invention. The PLD 100 includes: a plurality of blocks 180; a global interconnect array ("GIA") 105 for interconnecting blocks 180; dedicated input pads 175 which can be used to direct input directly to GIA 105; and input/output ("I/O") pads 155 which can be used either as input pads to send data indirectly through block 180 to GIA 105, or as output pads to transmit data form block 180. Selected lines 106 connect, and are used to send data from, GIA 105 to blocks 180. Block 180 comprises multiplexer 110, buffers 120, 145, and 160, logic array block ("LAB") 130, and lines 115, 125, 140, 150, and 165.

Figure 2:
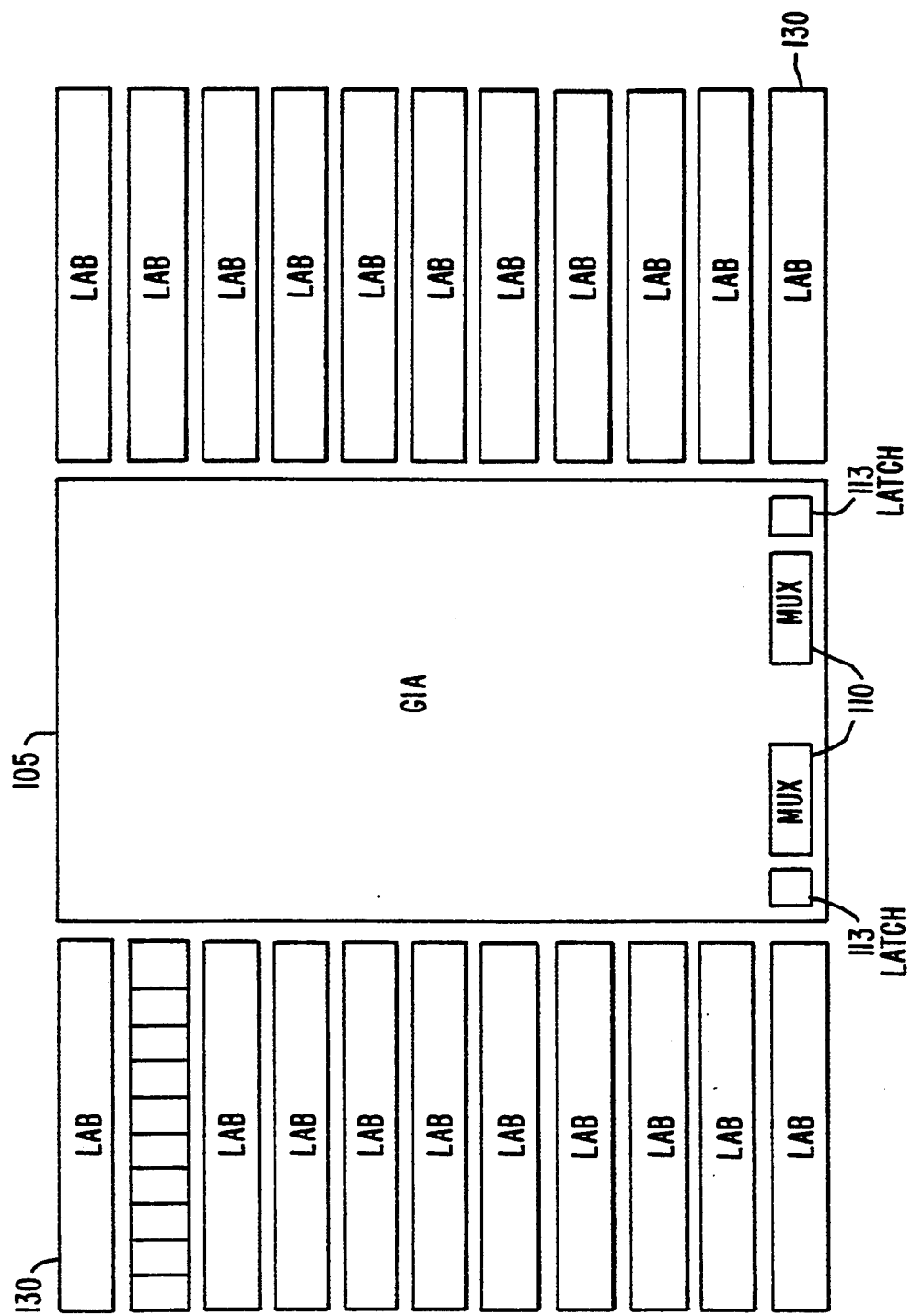
FIG. 2 is a simplified plan view of a chip for an embodiment of the present invention.

FIG. 2 shows a preferred chip organization for a PLD fabricated in accordance with the principles of the present invention. The PLD chip organization of FIG. 2 comprises two stacks of LABs 130 on either side of GIA 105. Multiplexers (MUXes) 110 and latches 113 are located under GIA 105. Latches 113 contain multiplexer architecture bits (i.e. data which controls the programming of MUXes 110). Any type of volatile or non-volatile programmable storage elements (e.g. static or dynamic random access memory, EPROM, or EEPROM), fuses, or antifuses can be used to store the architecture bits. The contents of these bits are automatically loaded to latches 113 upon power-up.

B. Logic Array Blocks

Figure 3:
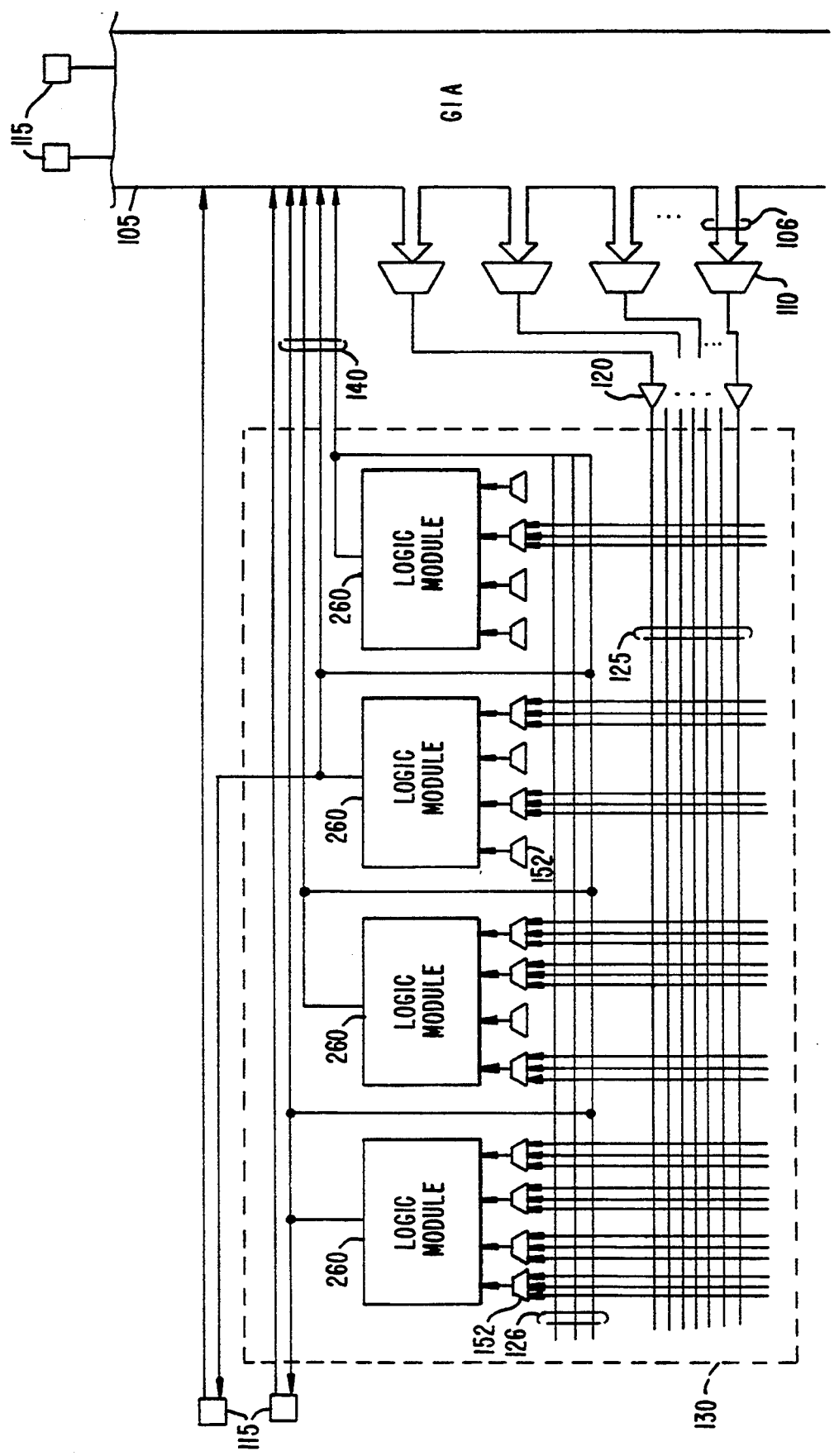
FIG. 3 is a simplified schematic block diagram of the illustrative embodiment of FIG. 1 showing a logic array block.

FIG. 3 shows a simplified schematic block diagram of a portion of PLD 100 constructed in accordance with the present invention, in which a portion of a LAB 130 is shown. LAB 130 includes an array of, for example, sixteen (only four shown) logic modules 260 and an interconnect region composed of LAB input lines 125 and local conductors 126. LAB input lines 125 and local conductors 126 are logical signal interconnect lines that preferably span the length of LAB 130. Selected groups of lines 106 from GIA 105 connect to the inputs of MUXes 110. The outputs of MUXes 110 connect to the LAB input lines 125 through buffers 120. Local conductors 126 connect to the buffered outputs of logic modules 260 which also connect directly to the GIA 105 as well as to I/O pads 155. Local conductors 126 provide for local feedback between logic modules 260 in the same LAB 130 and therefore do not extend beyond the associated LAB 130. Each one of LAB input lines 125 and local conductors 126 can connect to any input of any logic module 260 via MUXes 152.

Figure 4:
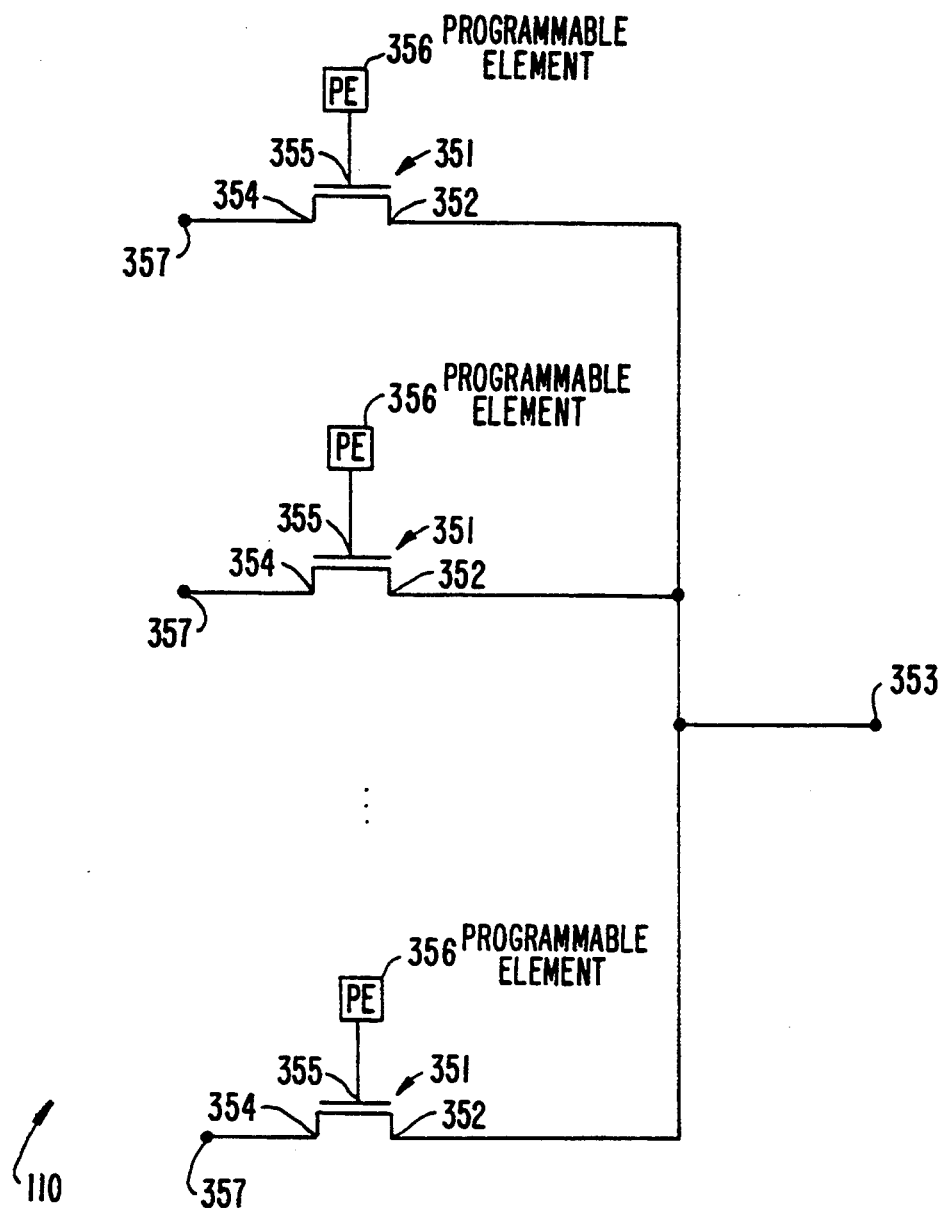
FIG. 4 is a schematic block diagram of a preferred embodiment of a multiplexer.

In an exemplary embodiment, shown in FIG. 4, multiplexer 110 comprises n pass transistors 351 with terminal 352 of each transistor connecting to common node 353 corresponding to the output of multiplexer 110, and each terminal 354 of transistor 351 corresponding to an input 357 of multiplexer 110 connecting to a respective global conductor. Gate 355 of each transistor 351 is controlled by programmable element (or "architecture bit") 356. Architecture bits are programmed into programmable storage elements by the user, and loaded to latches 113 upon power up. Thus, the user selects which of the lines of group 106 are connected to respective buffers 120. A similarly constructed multiplexer circuit can be used for MUXes 152.

C. Logic Modules

As the fundamental building block of PLD 100, each logic module 260 is capable of performing basic logic functions. Each logic module 260 includes a logic array that implements combinatorial logic functions and at least one programmable register for sequential logic. Existing GIA-based PLDs utilize an EPROM-based product term logic to implement the logic array. However, in order to further reduce the DC current, PLD 100 of the present invention employs a fully CMOS logic module to eliminate the DC current required by the EPROM array.

Figure 5:
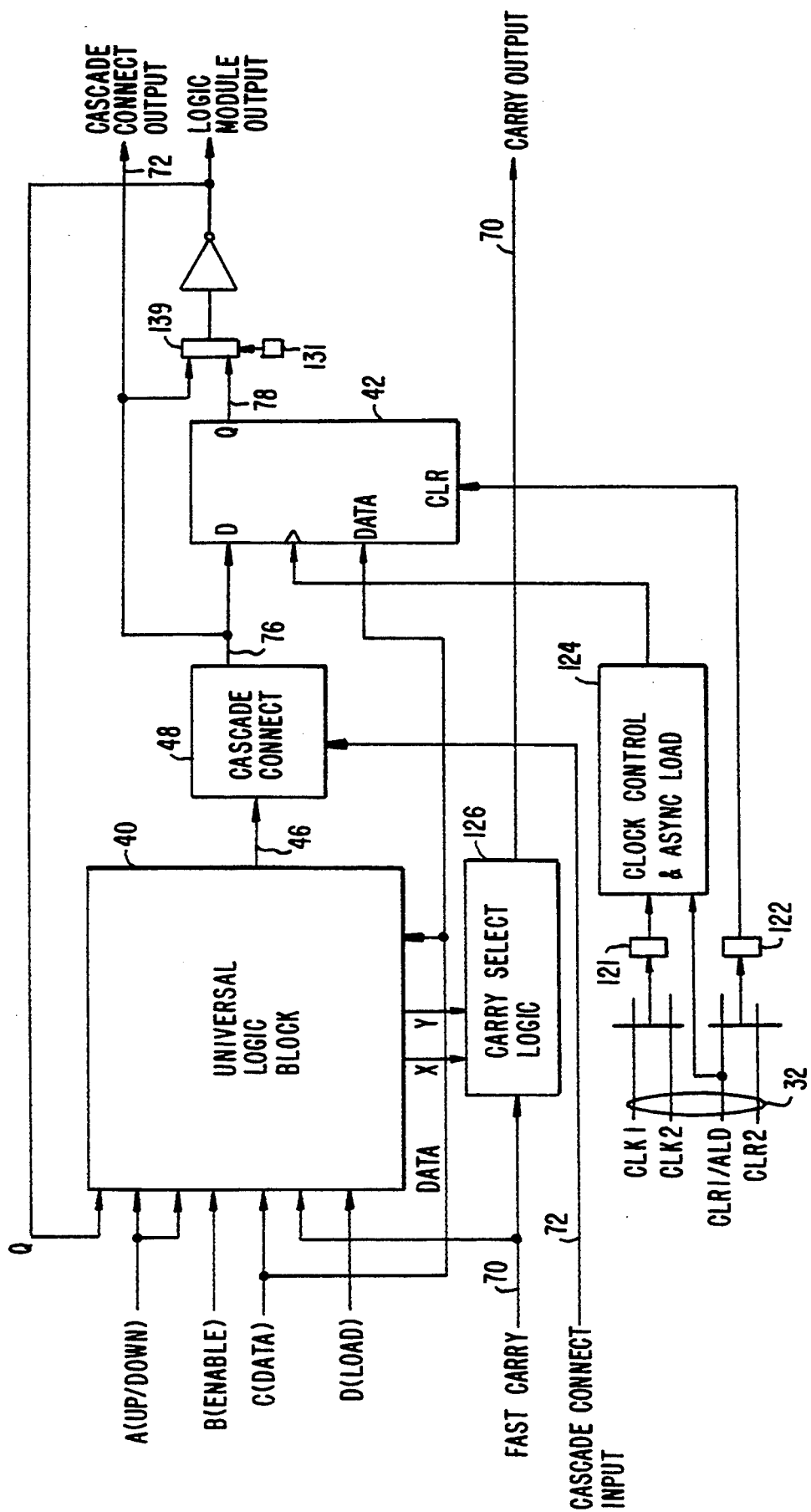
FIG. 5 is a schematic diagram showing one example of a CMOS logic module used in the present invention.

An exemplary embodiment of logic modules 260 as used in the present invention is shown in FIG. 5 and is described fully in commonly assigned U.S. patent application Ser. No. 07/880,942, filed May 8, 1992, now U.S. Pat. No. 5,260,611. As shown in FIG. 5, four inputs A, B, C, and D along with a fast carry input 70 and the output of a flip-flop 42 are available for application to a universal CMOS logic block 40. Feeding back the flip-flop output in this manner is useful when, for example, logic module 260 is to be used as one stage of a counter. Inputs A, B, and D act as data inputs as well as UP/DOWN, ENABLE, and LOAD inputs respectively. Input C is also applied directly to universal CMOS logic block 40 and to flip-flop 42 as data to facilitate loading data into the flip-flop when logic module 260 is to be used as one stage of a loadable counter. Cascade connect input 72 is applied as one input to logic element 48 (typically an AND gate). The desired signals on clock and clear lines 32 are selected by programmable (i.e., RAM-controlled) switches 121 and 122. The output of switch 122 is applied to the clear input terminal of flip-flop 42. The output of switch 121 and one of signals 32 are applied to clock control and asynchronous load control logic 124 to produce a signal applied to the clock input terminal of flip-flop 42. This signal controls the clocking of flip-flop 42, as well as the asynchronous loading of that flip-flop (e.g., when loading the starting value into a loadable counter).

The main data output 46 of universal CMOS logic block 40 is the other input to logic element 48. The output of element 48 is the DATA input to flip-flop 42 (for registered output from logic module 260). The output of element 48 can also bypass flip-flop 42 via programmable (i.e., RAM-controlled) switch 130 (for unregistered output from the logic module 260). Finally, the output of element 48 is also the cascade connect output 72 from this logic module to the next logic module 260 in the cascade connect chain.

Figure 6:
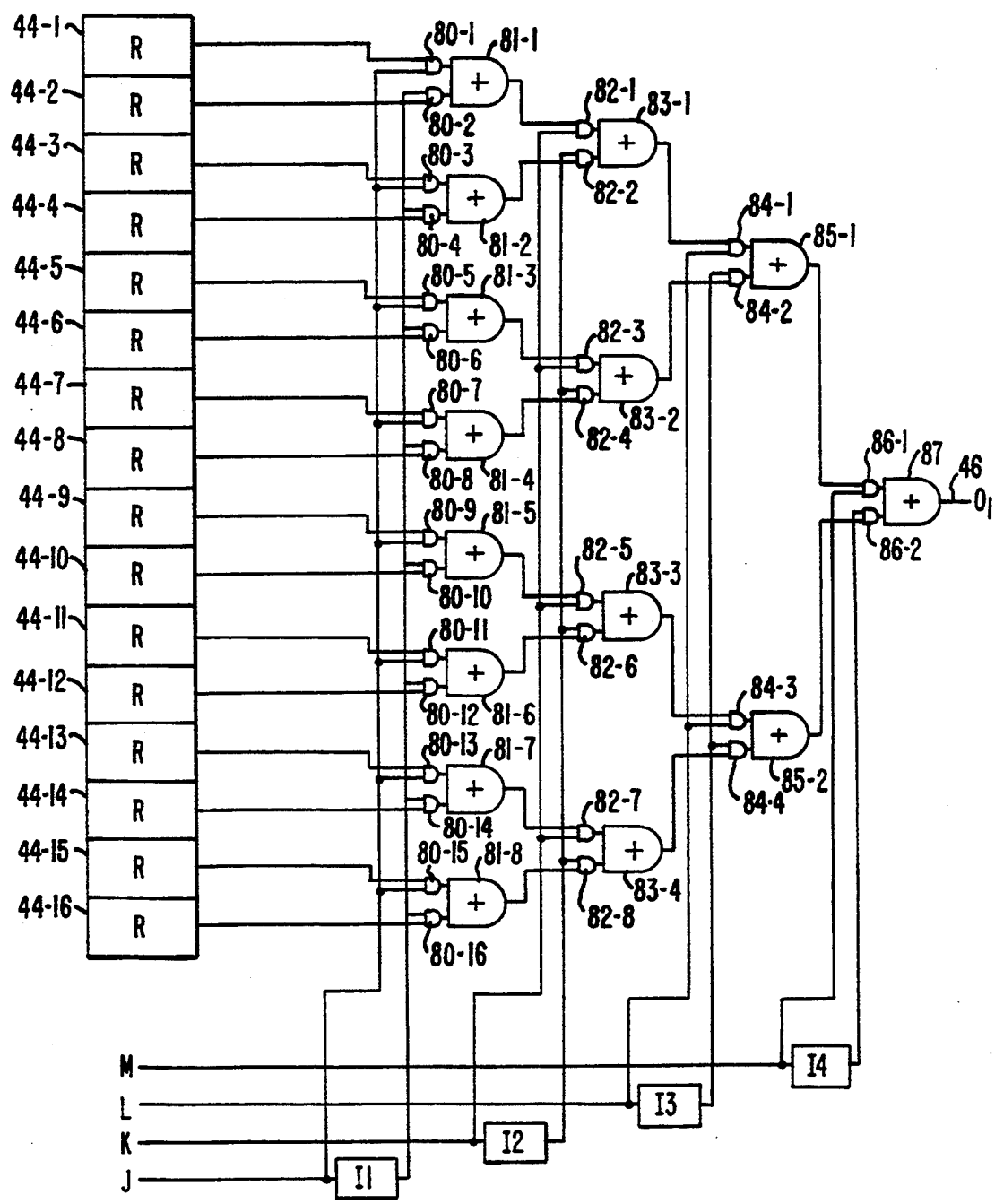
FIG. 6 is an example of a CMOS look-up table.

As will be readily apparent to those skilled in the art, the universal CMOS logic block 40 in FIG. 5 can be implemented using various CMOS logic circuits that consume zero power. FIG. 6 shows one example of a CMOS logic circuit implementing the universal CMOS logic block 40 using typical basic look-up table logic. This look-up table based logic block is fully described in a commonly-owned U.S. patent application Ser. No. 07/880,752, filed May 8, 1992. The look-up table is controlled by 16 programmable RAM cells 44. The output signal of each of these RAM cells is applied to a respective one of 16 AND gates 80. Alternate ones of AND gates 80 are respectively controlled by the true and complement of the first data input J, the complement of input J being produced by inverter I1. The outputs of adjacent pairs of switches 80 are then combined by OR gates 81 and applied to eight AND gates 82. Alternate ones of AND gates 82 are respectively controlled by the true and complement of the second data input K, the complement of input K being produced by inverter I2. The outputs of adjacent pairs of AND gates 82 are combined by OR gates 83 and then applied to four AND gates 84. Alternate ones of AND gates 84 are respectively controlled by the true and complement of the third data input L, the complement of input L being produced by inverter I3. The outputs of adjacent pairs of AND gates 84 are combined by OR gates 85 and applied to two AND gates 86. One of AND gates 86 is controlled by the true of the fourth data input M, while the other AND gate 86 is controlled by the complement of that input (produced by inverter I4). The outputs of AND gates 86 are combined by OR gate 87 to produce the data output on conductor 46. It will be apparent from the foregoing that any desired logical combination of data inputs J–M can be produced by appropriately programming RAM cells 44.

As described in the above-mentioned application Ser. No. 07/880,752, the look-up table of FIG. 6 can be modified to provide outputs X and Y, the logical NOR and logical NAND of two inputs to the look-up table. Referring back to FIG. 5, carry select logic 126 inverts X and Y, and then uses fast carry input 70 to select the appropriate one of the inverted signals as the fast carry output 70 to be applied to the next logic module 260 in the fast carry chain.

D. Global Interconnect Array

As described above, the present invention uses multiplexers 110 and GIA 105 instead of programmable elements in an EPROM array. The multiplexers must satisfy conflicting conditions. To ensure that the user has maximum flexibility in connecting global conductors to bit lines, the multiplexers should have as many inputs as possible. However, to keep the chip size as small as possible, the multiplexers should have as few inputs as possible. This conflict can be resolved with an interconnection pattern that maximizes the flexibility for a given small number of inputs. An example of one such pattern for a GIA-based PLD that uses EPROM product terms, is fully described in the above-mentioned patent application Ser. No. 07/691,640, now U.S. Pat. No. 5,241,224. The optimized pattern disclosed in that application is arrived at by defining a set of interconnection selection rules and developing an interconnection assignment algorithm. Using a computer aided engineering ("CAE") tool, the user can then customize the logic design based on that algorithm. A similar interconnection pattern can be developed for the PLD of the present invention taking into account variations in interconnection resources such as local conductors in each LAB.

Thus, a programmable logic device having a global interconnect array coupled to logic array blocks by programmable multiplexers is provided. The PLD of the present invention combines zero-power CMOS logic modules with high performance interconnect architecture to achieve high logic densities at lower power consumption levels. One skilled in the art will appreciate that the present invention can be practiced by other than the described embodiment, which is presented for purposes of illustration and not of limitation, and the present invention is limited only by the claims which follow.

What is claimed is:

1. A programmable logic device comprising:
   a plurality of complementary metal-oxide-semiconductor (CMOS) logic modules having zero standby current, each having a plurality of inputs and at least one output each one of said plurality of CMOS logic modules providing a logical combination of said plurality of inputs at said at least one output, said plurality of CMOS logic modules being grouped in a plurality of logic array blocks, said logic array blocks being disposed in linear stacks;
   a plurality of global conductors extending in one direction and interposed between said stacks of logic array blocks, with a subset of said global conductors coupled to a plurality of said at least one output of said plurality of CMOS logic modules; and
   a first plurality of multiplexers, each having a plurality of inputs coupled to a corresponding subset of said plurality of global conductors, at least one control input, and an output coupled to an input of said plurality of logic array blocks, said first plurality of multiplexers for programmably coupling a global conductor to a logic array block input in response to programming signals on said at least one control input;
   a second plurality of multiplexers each one having an output coupled to one of said plurality of logic module inputs, at least one control input, and a plurality of inputs coupled to a plurality of logic array block inputs, said second plurality of multiplexers for programmably coupling a plurality of logic array block inputs to said plurality of logic module inputs in response to programming signals on said at least one control input,
   wherein, a logic array block can communicate with another logic array block only via said plurality of global conductors and said first plurality of multiplexers.

2. A programmable logic device as recited in claim 1 wherein each of said logic array blocks further comprises local conductors for selectively coupling said at least one output of each of said plurality of logic modules in said logic array block to said plurality of inputs of said second plurality of multiplexers in said logic array block.

3. A programmable logic device as recited in claim 1 wherein said CMOS logic module comprises:
   a look-up table having a plurality of reprogrammable stored values, each of which is associated with a respective one of a plurality of possible combinations of said logic module inputs;
   means responsive to said logic module inputs for producing at said logic module output a stored value associated with a combination of said inputs currently being applied to said logic module; and means for registering said output of said logic module.

4. A programmable logic device comprising:
- a plurality of logic array blocks disposed in linear stacks, each logic array block having a plurality of inputs and a plurality of outputs;
- a plurality of global conductors extending in one direction and interposed between said stacks of logic array blocks; and
- a first plurality of multiplexers each having a plurality of inputs for receipt of a subset of said plurality of global conductors, and an output coupled to a selected one of said plurality of logic array blocks, wherein, each one of said logic array blocks further includes:
- a first plurality of conductors extending along a length of said logic array block, selected ones of said first plurality of conductors coupling to a selected output of a selected one of said first plurality of multiplexers;
- a second plurality of multiplexers each having a plurality of inputs coupled to a subset of said first plurality of conductors, and an output; and
- a plurality of logic modules each having a plurality of inputs with each input coupling to an output of a corresponding one of said second plurality of multiplexers, and at least one output, each logic module further including a complementary metal-oxide-semiconductor (CMOS) logic circuit having zero standby current, said CMOS logic circuit having a plurality of inputs coupled to said plurality of inputs of said logic module, and one output for carrying a logical combination of said plurality of inputs, wherein, a logic array block can communicate with another logic array block only via said plurality of global conductors and said first plurality of multiplexers.

5. The programmable logic device of claim 4 wherein each one of said plurality of logic array blocks further comprises a plurality of local conductors selectively coupling said at least one output of each one of said plurality of logic modules in said logic array block to said plurality of inputs of said second plurality of multiplexers.

6. The programmable logic device of claim 4, wherein said CMOS logic circuit further comprises:
- a lookup table having a plurality of data inputs coupled to said plurality of inputs of said logic circuit, a plurality of programming inputs, and an output; and
- reprogrammable storage means, coupled to said programming inputs of said lookup table, for storing values, each of which is associated with a respective one of a plurality of possible logical combinations of said logic circuit inputs.

7. The programmable logic device of claim 6, wherein said reprogrammable storage means are random access memory cells.

* * * * *